United States Patent [19]

Yin

[11] Patent Number: 5,705,946
[45] Date of Patent: Jan. 6, 1998

[54] LOW POWER LOW VOLTAGE LEVEL SHIFTER

[75] Inventor: Rong Yin, Coppell, Tex.

[73] Assignee: SGS-Thomson Microelectronics, Inc., Carrollton, Tex.

[21] Appl. No.: 473,321

[22] Filed: Jun. 7, 1995

[51] Int. Cl.[6] .................... H03K 5/01; H03K 19/00
[52] U.S. Cl. .................... 327/333; 327/374; 327/306; 326/63
[58] Field of Search .................... 327/333, 201, 327/256, 427, 306, 374, 108, 541, 62, 540, 537, 535; 326/62, 63, 85, 87, 81, 71, 30, 80

[56] References Cited

U.S. PATENT DOCUMENTS

| | | | |
|---|---|---|---|
| 4,794,283 | 12/1988 | Allen et al. | 326/68 |
| 5,113,097 | 5/1992 | Lee | 327/81 |
| 5,237,212 | 8/1993 | Maekawa | 327/333 |

FOREIGN PATENT DOCUMENTS

| | | | |
|---|---|---|---|
| 53-128259 | 9/1978 | Japan . | |
| 1273417 | 11/1989 | Japan | 327/333 |

OTHER PUBLICATIONS

"High Performance Totem–Pole Drive," *IBM Technical Disclosure Bulletin* 31(10): 304–306, Mar., 1989.

*Primary Examiner*—Timothy P. Callahan
*Assistant Examiner*—Dinh T. Le
*Attorney, Agent, or Firm*—David V. Carlson; Theodore E. Galanthay; Lisa K. Jorgenson

[57] ABSTRACT

A low power, low voltage level shifter is provided. The voltage level shifter includes a first switching circuit, and a second switching circuit. The first switching circuit has a first input terminal for receiving a first oscillating signal, and based on the first oscillating signal, switches the output of the first switching circuit between a first voltage level and a second voltage level. The second switching circuit has a second input terminal connected to the output terminal of the first switching circuit. The second switching circuit also has a third input terminal for receiving a second oscillating signal which is out of phase with the first oscillating signal. Based on the input signals received, the second switching circuit generates an output signal that switches between a third voltage level and a fourth voltage level at a selected rate and frequency.

20 Claims, 2 Drawing Sheets

LOW POWER LOW VOLTAGE LEVEL SHIFTER

TECHNICAL FIELD

This invention relates to semiconductor devices, and more particularly, to a clock generator circuit.

BACKGROUND OF THE INVENTION

Clock generator circuits for timing various logic circuits are well known in the art. A clock generator generally includes an oscillating signal source and a voltage level shifter. In many clock generator circuits, a crystal oscillator is used as the oscillating signal source and an inverter is used as the voltage level shifter. The crystal oscillator generates a sine wave type of oscillating signal which is connected to the input of the inverter. Based on the oscillating signal, the inverter in the clock circuit shifts or switches between a logic zero and logic one. One disadvantage of this method, however, is that because the oscillating signal rises and falls at a relatively slow rate, the switching time of the inverter is very long. A further disadvantage is that the slow switching time of the clock circuit propagates throughout the logic circuits being driven by the clock circuit. This causes a large power dissipation in those logic circuits which is highly undesirable. Because of the large power dissipation, this type of clock generators are especially unsuitable for battery-powered portable electronic devices such as digital watches and notebook computers.

It is therefore desirable to provide a clock generator circuit with a fast switching time. It is also desirable to provide such clock generator circuit without increasing the current drain during its switching period.

SUMMARY OF THE INVENTION

According to the principles of the present invention, a low power, low voltage level shifter is provided. The voltage level shifter includes a first switching circuit, and a second switching circuit. The first switching circuit has a first input terminal for receiving a first oscillating signal. Based on the first oscillating signal, the first switching circuit switches its output between a first voltage level and a second voltage level. The second switching circuit has a second input terminal connected to the output terminal of the first switching circuit. The second switching circuit also has a third input terminal for receiving a second oscillating signal which is out of phase with the first oscillating signal.

In a preferred embodiment, the first switching circuit is an inverter circuit having a pair of transistors connected in series. Each transistor is biased to a threshold voltage and is coupled to a capacitor. The biasing means and the capacitor shifts the first oscillating signal to a predetermined DC voltage at the control terminal of each transistor. The second switching circuit includes an inside pair of transistors and an outside pair of transistors all of which are connected in series. Each of the outside pair of transistors is biased to a threshold voltage and is coupled to a capacitor. The biasing means and the capacitor shifts the second oscillating signal to a predetermined DC voltage at the control terminal of each of the outside pair of transistors. The output of the first switching circuit is connected to the control terminals of the inside pair of transistors. Based on the input signals received, the second switching circuit generates an output signal that switches between a third voltage level and a fourth voltage level at a selected rate and frequency.

DETAILED DESCRIPTION OF THE INVENTION

Figure 1:
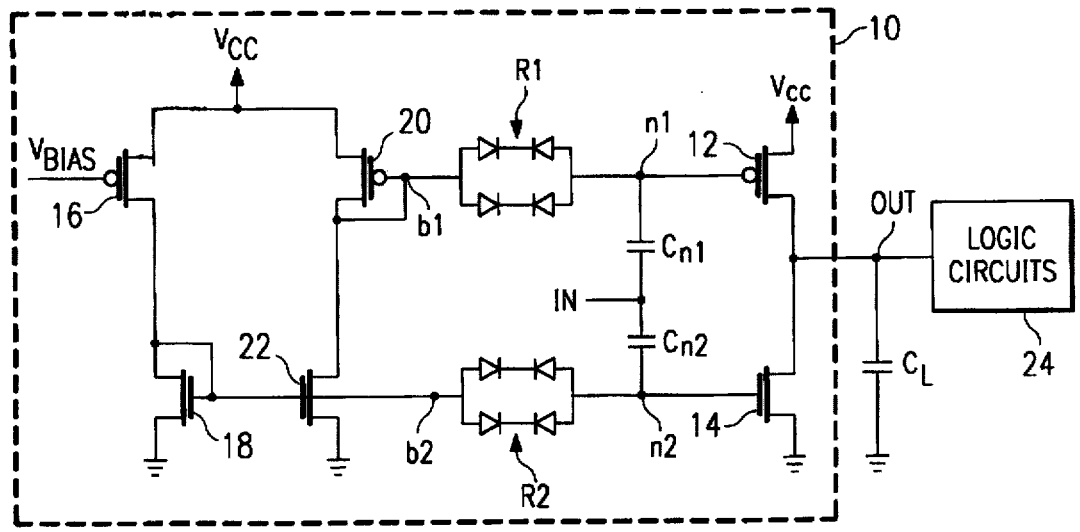
FIG. 1 is a schematic circuit diagram of an AC coupled inverter circuit according to the prior art.

FIG. 1 is a schematic circuit diagram of an AC coupled inverter circuit 10 according to the prior art. The inverter or switching circuit 10 includes a PMOS transistor 12 and NMOS transistor 14 connected in series with each other. A current mirror circuit well known in the art is used to bias the two transistors 12 and 14. The current mirror circuit includes a PMOS transistor 16 and NMOS transistor 18 connected in series, and a PMOS transistor 20 and NMOS transistor 22 also connected in series with each other. The gate and drain terminals of transistor 18 are shorted together. The gate and drain terminals of transistor 20 are also shorted together. The gate terminals of transistors 18 and 22 are connected to each other. The bias voltage $V_{bias}$ at the gate terminal of transistor 16 is typically slightly less than $V_{CC}-V_{tp}$ (threshold voltage of a PMOS transistor) of transistor 16. For example, if $V_{tp}$ is equal to −1 volt, and $V_{CC}$ equals 3 volts, $V_{bias}$ is equal to approximately 1.8 volt. When properly biased, the voltage level at node b1 is $V_{CC}-V_{tp}$, which in this example is 2 volts. The voltage level at node b2 is $V_{tn}$ (threshold voltage of an NMOS transistor) of transistor 18 which may be approximately 0.7 volt. Impedance device $R_1$ is connected to the gate terminal of transistor 20 and resistor $R_2$ is connected to gate terminals of transistors 18 and 22. Both impedance devices $R_1$ and $R_2$ have very high resistance values, i.e., 1 giga-ohm, which are formed by lightly doped or undoped polysilicon to electrically form diodes, as is well known in the art. Other impedance devices, such as resistors are also used. A capacitor $C_{n1}$ is placed between an input terminal node in and node n1, and a capacitor $C_{n2}$ is placed between node in and node n2. A capacitive load of the logic circuits 24 being driven by the inverter circuit 10 is shown as $C_L$. Hereinafter, assume that for simplicity $V_{tp}$ is −1 volt and $V_{tn}$ is 1 volt for all transistors. Further assume that $V_{CC}$ is 5 volts.

Figure 2:
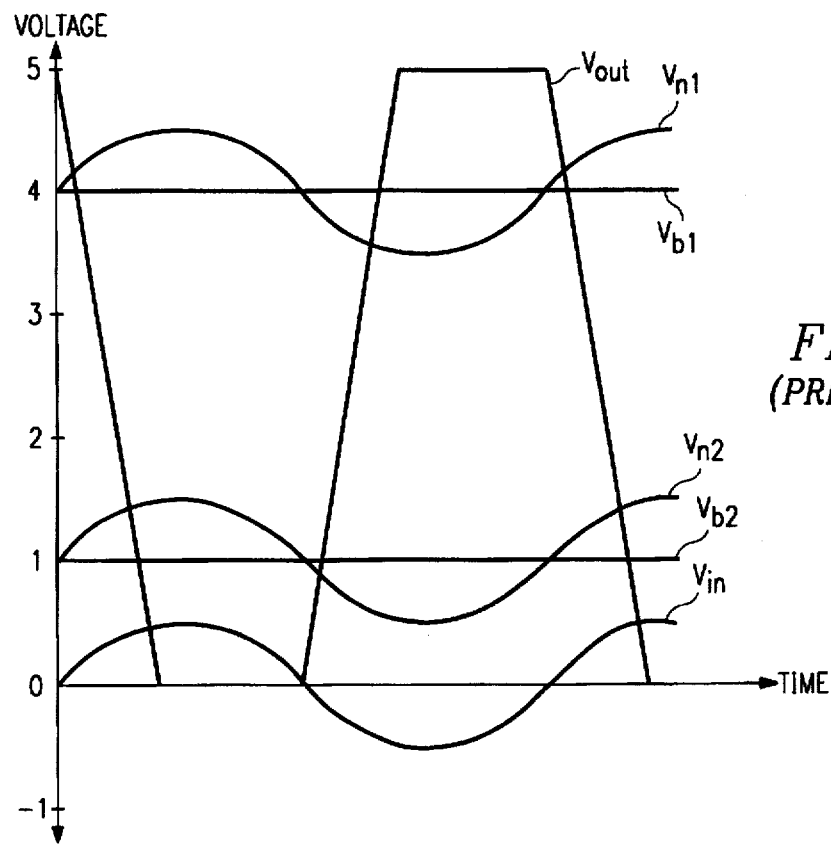
FIG. 2 is a graph of voltage levels over time of various nodes on the inverter circuit of FIG. 1.

FIG. 2 is a graph of voltage levels over time of various nodes on the inverter circuit 10 of FIG. 1. Referring to both FIGS. 1 and 2, if properly biased, $V_{b1}$ is at 4 volts and $V_{b2}$ at 1 volt. As shown in FIG. 2, the voltage level at node n1 oscillates along a DC voltage of $V_{CC}-V_{tp}$ due to capacitive coupling of input voltage $V_{in}$ with capacitor $C_{n1}$. Similarly, the voltage level at node n2 oscillates along a DC voltage of $V_{tn}$ also due to capacitive coupling of input voltage $V_{in}$ with capacitor $C_{n2}$. The AC-coupled inverter circuit 10 operates as follows. When $V_{n1}$ is at 4.5 volts and $V_{n2}$ is at 1.5 volts, transistor 12 is off since $V_{gs}$ of −0.5 volt is above the threshold voltage of −1 volt required to turn on transistor 12. On the other hand, transistor 14 is on since $V_{gs}$ of 1.5 volt is higher than the threshold voltage of 1 volt required to turn on transistor 14. Thus, $V_{out}$ is grounded through transistor 14 to a logic zero. As $V_{n1}$ decreases and crosses the 4 volt level, transistor 12 begins to turn on while transistor 14 begins to turn off. When $V_{n1}$ is at 3.5 volts and $V_{n2}$ is at 0.5 volts, transistor 14 is off and transistor 12 is on. Thus, $V_{out}$ switches from a logic zero to logic one through transistor 12 which charges capacitive load $C_L$ to approximately 5 volts.

The problem recognized by the applicant is that because the oscillating input signal $V_{in}$ rises and falls at a relatively slow rate, the switching time of the inverter circuit 10 is very long. The slow switching time propagates throughout the logic circuits 24 being driven by the inverter circuit 10 and causes a large power dissipation in those logic circuits which is highly undesirable. Because of the large power dissipation, this type of clock generators 10 are especially unsuitable for battery-powered portable electronic devices such as digital watches and notebook computers.

Figure 3:
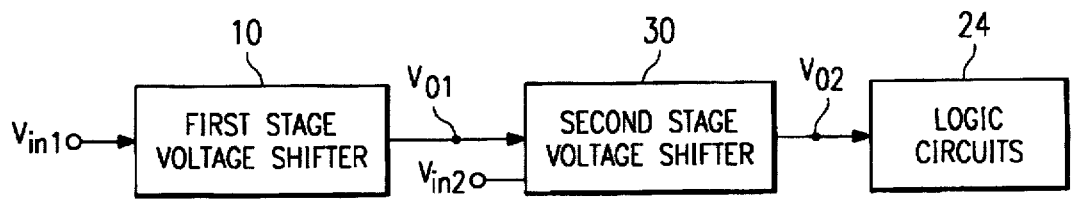
FIG. 3 is a block diagram of a two stage voltage level shifter according to the present invention.

FIG. 3 is a block diagram of a voltage level shifter according to principles of the present invention. The voltage level shifter uses a first and second stage level shifter connected in series. A second switching circuit 30 is connected to the output of a first switching circuit 10. The first stage 10 receives the oscillating voltage $V_{in1}$ and outputs a level shifted voltage at terminal $V_{O1}$. The input voltage $V_{in1}$ is an oscillating signal causing the output $V_{O1}$ to oscillate between logic high and logic low states. The output $V_{O1}$ from the first stage voltage shifter is input to control terminals of a second stage voltage shifter 30. The second stage voltage shifter 30 also receives $Vin_2$ as an input to control terminals. The second stage voltage shifter 30 outputs a signal $V_{O2}$ for providing the clock signals to the various logic circuits 24 which make up the integrated circuit.

According to the present invention, the output signal $V_{O2}$ rapidly switches from a high state to low state providing an improved clock signal with faster rise time and fall time than the initial output signal $V_{O1}$. This improved performance is obtained by ensuring that the signals $Vin_1$ and $Vin_2$ are out of phase with each other and preferably are at exactly 180° out of phase.

According to one embodiment of the present invention, the first stage voltage shifter 10 corresponds to the prior art voltage shifter as shown in FIG. 1. The second stage voltage shifter 30 is comprised of a voltage shifter having two input signals coupled to two respective control signals with a second oscillator input $Vin_2$ providing the final switching signal to the output terminal $V_{O2}$.

Figure 4:
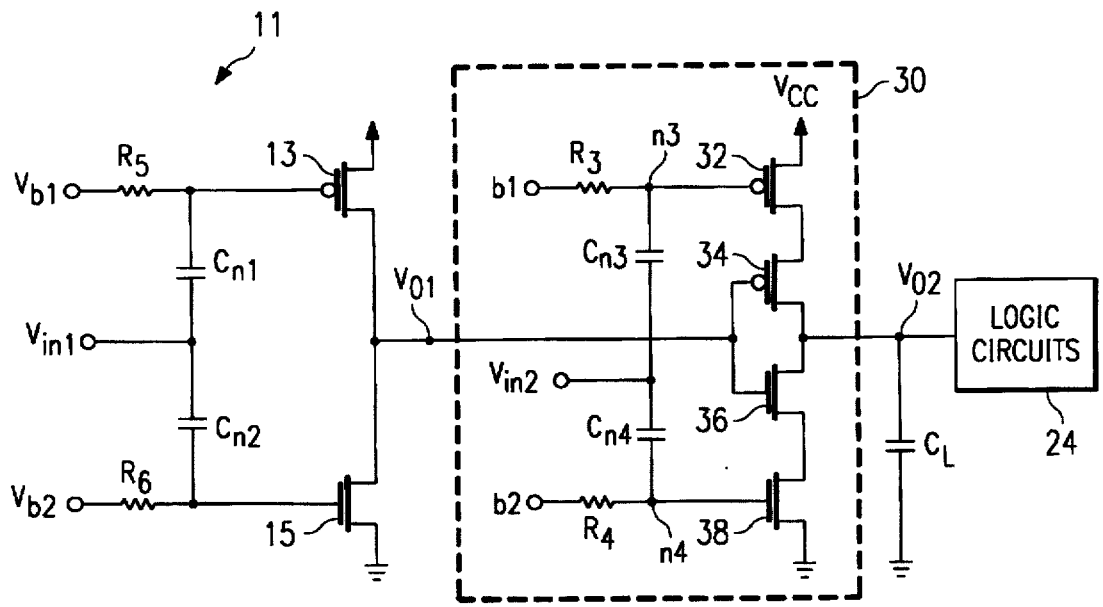
FIG. 4 is a detailed circuit schematic of one preferred embodiment of the two stage voltage level shifter of FIG. 3.

FIG. 4 shows one preferred embodiment of the detailed circuits which may be used in the first stage voltage shifter and the second stage voltage shifter according to the present invention. According to this embodiment, the first stage voltage shifter 11 is constructed more simply to include impedance devices $R_5$ and $R_6$ that bias the gates of the respective transistors 13 and 15 to the desired level based on principles previously explained herein. The impedance devices $R_5$ and $R_6$ may be simple resistors or, alternatively, may be high impedance device polysilicon load resistors which electrically appear as reverse junction diodes, a MOS transistor or other acceptable high impedance devices. Of course, the back-to-back diode structure as shown in FIG. 1 for $R_1$ and $R_2$ may also be used.

The second switching circuit 30 includes two PMOS transistors 32 and 34 and two NMOS transistors 36 and 38 all of which are connected in series with each other as shown in FIG. 3. The drain terminals of transistors 34 and 36 define an output node $V_{O2}$. A capacitive load $C_L$ of the logic circuits 24 is represented by a capacitor $C_L$ which is shown as coupled between the output node $V_{O2}$ and ground. The output voltage $V_{O1}$ of the inverter circuit 10 is connected to the gate terminals of transistors 34 and 36. A second input signal in2 is coupled to the gate terminals of transistors 32 and 38 through capacitors $C_{n3}$ and $C_{n4}$ respectively. The voltage level $V_{in2}$ is out of phase with $V_{in1}$ and preferably is 180 degrees out of phase with each other. As in FIG. 1, nodes b1 and b2 are connected to the gate terminals of transistors 20 and 18, respectively. Bias resistor $R_3$ is connected between node b1 and node n3 to provide a bias voltage of approximately 4 volts at node n3. Similarly, bias resistor $R_4$ is connected between node b2 and node n4 to provide a bias voltage of approximately 1 volt at node n4.

Figure 5:
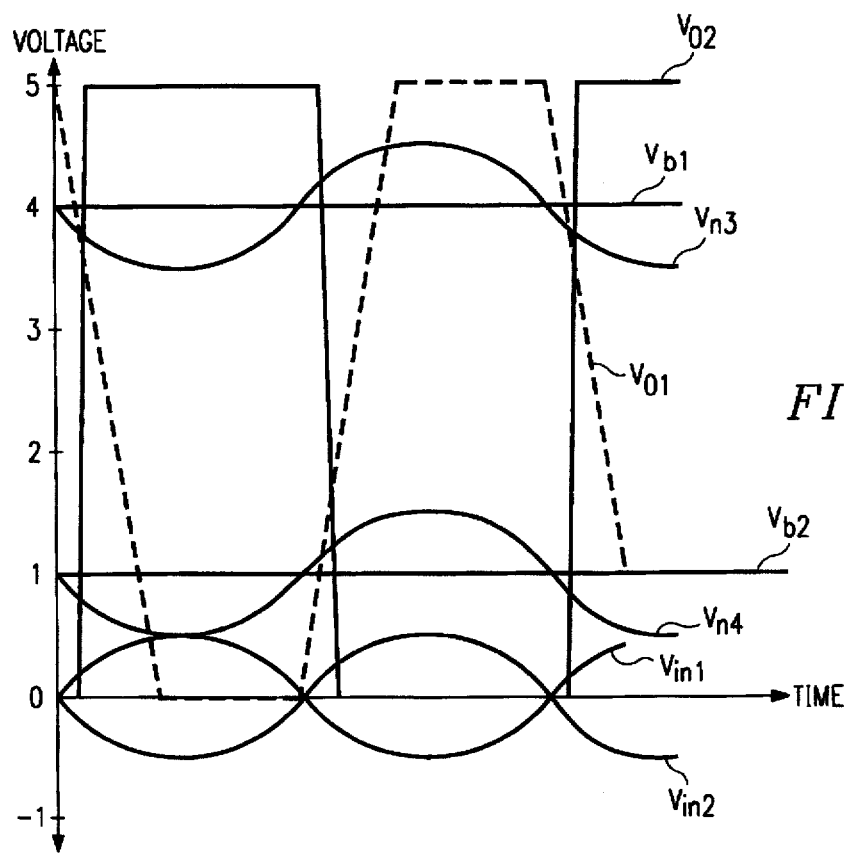
FIG. 5 is a graph of voltage levels over time of various nodes on the voltage level shifter of FIG. 3.

FIG. 5 is a graph of voltage levels over time of various nodes on the voltage level shifter of FIG. 3. Referring to both FIGS. 3 and 4, the voltage level shifter according to the present invention operates as follows. When $V_{in2}$ is at 0.5 volt, $V_{n3}$ is at 4.5 volts and $V_{n4}$ is at 1.5 volts due to the biasing voltages $V_{b1}$ and $V_{b2}$. In this state, transistor 32 is off since $V_{gs}$ of −0.5 volt is above the threshold voltage of transistor 32. Transistor 38, on the other hand, is on because $V_{gs}$ of 1.5 volts is greater than the threshold voltage of transistor 38. With $V_{in2}$ at 0.5 volts, $V_{in1}$ is at −0.5 volt (phase shift of 180 degrees) and output voltage $V_{O1}$ is at logic high or 5 volts. The 5 volt signal turns off transistor 34 and turns on transistor 36. Thus, the output $V_{O2}$ of the voltage level shifter circuit is at logic zero or 0 volt due to the conductive path to ground provided by transistors 36 and 38.

As $V_{in2}$ begins to fall from +0.5 volt to −0.5 volt, transistors 32 and 34 turn on and transistors 36 and 38 turn off in the following sequence. As $V_{in2}$ falls below zero volt, transistor 32 turns on while transistor 38 turns off. Shortly thereafter, $V_{O1}$ begins to fall from 5 volts to 0 volt. As $V_{O1}$ falls below 4 volts, transistor 34 turns on. As $V_{O1}$ falls further and below 1 volt, transistor 36 turns off. Once both transistors 36 and 38 are turned off and transistors 32 and 34 are turned on, $V_{O2}$, previously at logic low, switches to logic high through a conductive path provided by the two transistors 32 and 34 which rapidly charges the capacitive load $C_L$.

As $V_{in2}$ begins to rise from −0.5 volt to +0.5 volts, the reverse occurs. As $V_{in2}$ rises above zero volt, transistor 32 turns off while transistor 38 turns on. Shortly thereafter, $V_{O1}$ begins to rise from 0 volt to 5 volts. As $V_{O1}$ rises above 1 volt, transistor 36 turns on. As $V_{O1}$ rises further and above 4 volts, transistor 34 turns off. Once both transistors 36 and 38 are turned on and transistors 32 and 34 are turned off, $V_{O2}$, previously at logic high, switches to logic low through a conductive path to ground provided by transistors 36 and 38.

Persons of ordinary skill in the art will appreciate that transistors 32 and 38 control charge/discharge of current at the output terminal node voltage $V_{O2}$ and the output voltage at node $V_{O1}$ controls the switching time. Since input voltages of transistors 34 and 36 swings from 0 to 5 volts with a relatively fast transient signal, the switching time of logic state at the output terminal node $V_{O2}$ is very fast. Further, because at least one transistor among the transistors 32–38 is off at any given time, switching operation of the voltage level shifter is accomplished without additional DC current or at most a very small leakage current.

While only one embodiment is shown and described, many other embodiments are possible within the spirit of the invention. For example, while the oscillating input signal is described as a sine wave type, other types including square wave types may also be used as an input to the voltage level shifter. Accordingly, the scope of the invention is not limited to the foregoing specification, but instead is given by the appended claims, along with their full range of equivalents.

I claim:

1. A voltage level shifter comprising:
   a first switching circuit having a first input terminal for receiving a first oscillating signal and a first output terminal, the first switching circuit switching the first oscillating signal between a first voltage level and a second voltage level at the first output terminal; and a second switching circuit having a second input terminal connected to the first output terminal, a second output terminal, and a third input terminal for receiving a second oscillating signal, the second oscillating signal being out of phase with the first oscillating signal, the second switching circuit switching the second oscillating signal between a third voltage level and a fourth voltage level at the second output terminal based on the second oscillating signal and the switched first oscillating signal, the switched first oscillating signal controlling the switching time of the second oscillating signal switching between the third voltage level and the fourth voltage level.

2. The shifter according to claim 1 wherein the first switching circuit includes a first switch and a second switch connected in series with each other, each having a control terminal coupled to the first oscillating signal.

3. The shifter according to claim 2 wherein the first switching circuit includes:

first AC coupling means coupled between the first input terminal and the first switch;

second AC coupling means coupled between the first input terminal and the second switch;

a first DC bias circuit coupled to the first switch; and a second DC bias circuit coupled to the second switch.

4. The shifter according to claim 3 wherein the first and second DC bias circuits are coupled to the control terminals of the first and second switches, respectively.

5. The shifter according to claim 1 wherein the second switching circuit includes:

a first transistor; and a second transistor connected in series with the first transistor, the node between the two transistors defining the second output terminal, wherein the control terminals of the first and second transistors are connected to the first output terminal.

6. The shifter according to claim 5 wherein the second switching circuit further includes:

a third transistor connected in series with the first transistor; and a fourth transistor connected in series with the second transistor, wherein the control terminals of the third and fourth transistors are coupled to the third input terminal.

7. A voltage level shifter comprising:

an inverter having a first output terminal and a first input terminal for receiving a first oscillating signal; and a switching circuit having a second output terminal, a second input terminal connected to the first output terminal, and a third input terminal for receiving a second oscillating signal, the second oscillating signal being out of phase with the first oscillating signal, the switching circuit for shifting the second oscillating signal between a first voltage level and a second voltage level at the second output terminal based on the second oscillating signal and the voltage level at the second input terminal, the voltage level at the second input terminal controlling the switching time of the second oscillating signal shifting between the first voltage level and the second voltage level.

8. The shifter according to claim 7 wherein the switching circuit includes:

a first transistor; and a second transistor connected in series with the first transistor and defining the second output terminal therebetween, wherein the gate terminals of the first and second transistors are connected to the first output terminal.

9. The shifter according to claim 8 wherein the switching circuit further includes:

a pull-up transistor connected in series with the first transistor for shifting the voltage level at the second output terminal to the first voltage level; and a pull-down transistor connected in series with the second transistor for shifting the voltage level at the second output terminal to the second voltage level, wherein the gate terminals of the pull-up and pull-down transistors are coupled to the third input terminal.

10. A method of generating a clock signal alternating between first and second logic states, the method comprising:

receiving a first oscillating signal;

receiving a second oscillating signal out of phase with the first oscillating signal;

switching the first oscillating signal between a first voltage level and a second voltage level;

receiving the switched first oscillating signal;

controlling the switching time of the alternating first and second logic states with the switched first oscillating signal; and generating the alternating first and second logic states based on the switched first oscillating signal, and the received second oscillating signal.

11. The method according to claim 10 wherein the first and second oscillating signals are substantially 180 degrees out of phase.

12. The method according to claim 10, prior to the step of generating the alternating first and second logic states, further comprising the step of shifting the second oscillating signal by a predetermined DC voltage level.

13. A voltage level shifter comprising:

a first switching circuit having a first input terminal for receiving a first oscillating signal and a first output terminal, the first switching circuit including a first switch and a second switch connected in series with each other, each having a control terminal coupled to the first oscillating signal, the first switching circuit for switching the first oscillating signal between a first voltage level and a second voltage level at the first output terminal; and a second switching circuit having a second input terminal connected to the first output terminal, a second output terminal, and a third input terminal for receiving a second oscillating signal, the second oscillating signal being out of phase with the first oscillating signal, the second switching circuit for switching the second oscillating signal between a third voltage level and a fourth voltage level at the second output terminal based on the second oscillating signal and the switched voltage levels at the first output terminal.

14. A voltage level shifter comprising:

a first switching circuit having a first input terminal for receiving a first oscillating signal and a first output terminal, the first switching circuit for switching the first oscillating signal between a first voltage level and a second voltage level at the first output terminal; and a second switching circuit having a second input terminal connected to the first output terminal, a second output terminal, and a third input terminal for receiving a second oscillating signal, the second oscillating signal being out of phase with the first oscillating signal, the second switching circuit including a first transistor and a second transistor connected in series with the first transistor, the node between the two transistors defining the second output terminal, wherein the control terminals of the first and second transistors are connected to the first output terminal, the second switching circuit for switching the second oscillating signal between a third voltage level and a fourth voltage level at the second output terminal based on the second oscillating signal and the switched voltage levels at the first output terminal.

15. A voltage level shifter comprising:

an inverter having a first output terminal and a first input terminal for receiving a first oscillating signal; and a switching circuit having a second output terminal, a second input terminal connected to the first output terminal, and a third input terminal for receiving a second oscillating signal, the second oscillating signal being out of phase with the first oscillating signal, the switching circuit including a first transistor and a second transistor connected in series with the first transistor and defining the second output terminal there between wherein the gate terminals of the first and second transistors are connected to the first output terminal, the switching circuit for shifting the second oscillating signal between a first voltage level and a second voltage level at the second output terminal based on the second oscillating signal and the voltage level at the first output terminal.

16. A voltage level shifter comprising:

a first switching circuit having a first input terminal for receiving a first oscillating signal and a first output terminal, the first switching circuit for switching the first oscillating signal between a first voltage level and a second voltage level at the first output terminal;

a second switching circuit having a second input terminal connected to the first output terminal, a second output terminal, and a third input terminal for receiving a second oscillating signal, the second oscillating signal being out of phase with the first oscillating signal, the second switching circuit for switching the second oscillating signal between a third voltage level and a fourth voltage level at the second output terminal based on the second oscillating signal and the switched voltage levels at the first output terminal; and the first switching circuit including a first switch and a second switch connected in series with each other, each having a control terminal coupled to the first input terminal.

17. A voltage level shifter comprising:

a first switching circuit having a first input terminal for receiving a first oscillating signal and a first output terminal, the first switching circuit for switching the first oscillating signal between a first voltage level and a second voltage level at the first output terminal;

a second switching circuit having a second input terminal connected to the first output terminal, a second output terminal, and a third input terminal for receiving a second oscillating signal, the second oscillating signal being out of phase with the first oscillating signal, the second switching circuit for switching the second oscillating signal between a third voltage level and a fourth voltage level at the second output terminal based on the second oscillating signal and the switched voltage levels at the first output terminal; and the second switching circuit including a first transistor and a second transistor connected in series with the first transistor, the node between the two transistors defining the second output terminal, the control terminals of the first and second transistors being connected to the first output terminal.

18. The shifter according to claim 17 wherein the second switching circuit further includes:

a third transistor connected in series with the first transistor; and a fourth transistor connected in series with the second transistor, wherein the control terminals of the third and fourth transistors are coupled to the third input terminal.

19. A voltage level shifter comprising:

an inverter having a first output terminal and a first input terminal for receiving a first oscillating signal;

a switching circuit having a second output terminal, a second input terminal connected to the first output terminal, and a third input terminal for receiving a second oscillating signal, the second oscillating signal being out of phase with the first oscillating signal, the switching circuit for shifting the second oscillating signal between a first voltage level and a second voltage level at the second output terminal based on the second oscillating signal and the voltage level at the first output terminal; and the switching circuit including a first transistor and a second transistor connected in series with the first transistor and defining the second output terminal therebetween, the gate terminals of the first and second transistors being connected to the first output terminal.

20. The shifter of claim 19 wherein the switching circuit further includes:

a pull-up transistor connected in series with the first transistor for shifting the voltage level at the second output terminal to the first voltage level; and a pull-down transistor connected in series with the second transistor for shifting the voltage level at the second output terminal to the second voltage level, wherein the gate terminals of the pull-up and pull-down transistors are coupled to the third input terminal.

* * * * *